Jan. 10, 1961 W. SHOCKLEY ET AL 2,967,985

TRANSISTOR STRUCTURE

Filed April 11, 1957 2 Sheets-Sheet 1

WILLIAM SHOCKLEY &
ROBERT N. NOYCE
INVENTORS

BY Flehr & Swain
ATTORNEYS

WILLIAM SHOCKLEY &
ROBERT N. NOYCE
INVENTORS

BY Flehr & Swain
ATTORNEYS

United States Patent Office 2,967,985

Patented Jan. 10, 1961

2,967,985

TRANSISTOR STRUCTURE

William Shockley, 23466 Corta Via, and Robert N. Noyce, both of Los Altos, Calif.; said Noyce assignor, by mesne assignments, to said Shockley Filed Apr. 11, 1957, Ser. No. 652,117

5 Claims. (Cl. 317—235)

Figure 1:
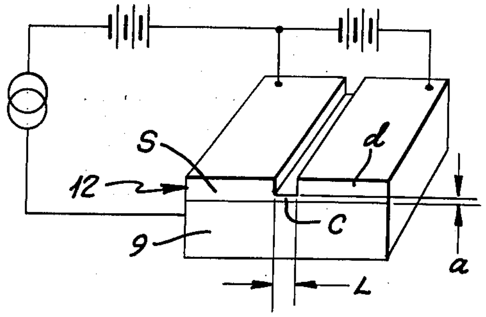

This invention relates generally to an improved transistor structure, and more particularly to a unipolar field effect transistor structure.

In order to achieve high frequency response, it is necessary that the channel in the transistor be short and thin, that is, that it be small in two directions. To achieve frequency responses in the order of 10 megacycles, the length of the channel should be in the order of a few thousandths of an inch. In constructing a device having a channel with such small dimensions, difficulty may be experienced in making a mechanically strong structure.

It is an object of the present invention to provide an improved transistor structure.

It is another object of the present invention to provide a transistor structure which is suitable for high frequency operation.

It is another object of the present invention to provide a unipolar field effect transistor in which the channel is small in two directions.

It is another object of the present invention to provide a transistor structure in which the source and drain areas form a low capacity junction with relatively high breakdown voltage with the gate and in which the junction between the channel and gate is abrupt.

It is another object of the present invention to provide a unipolar field effect transistor in which the capacitance from gate to the region where contact is made to the source and drain is relatively small whereby the transistor may be operated at high frequencies without capacitive loading.

The invention possesses other objects and features of advantage, some of which with the foregoing will be set forth in the following description of the invention. It is to be understood, of course, that the invention is not to be limited to the disclosure of a particular species of the invention, as other embodiments thereof may be adopted within the scope of the appended claims.

Figure 3:
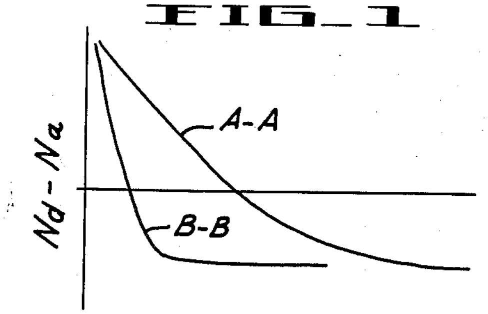
Figure 4:
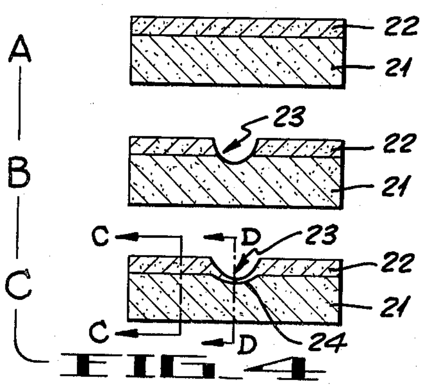
Figure 5:
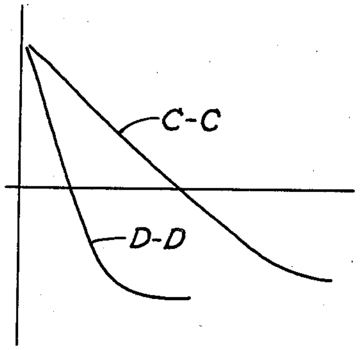
Figure 8:
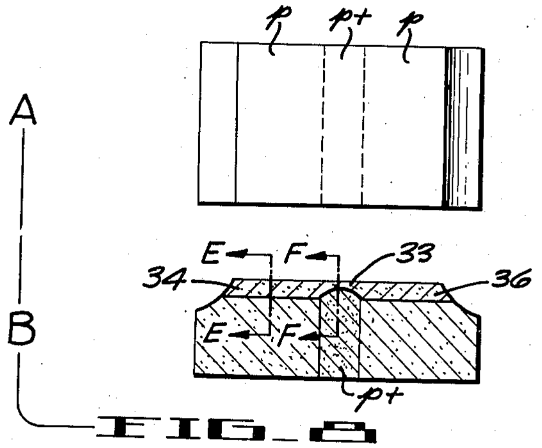
Figure 9:
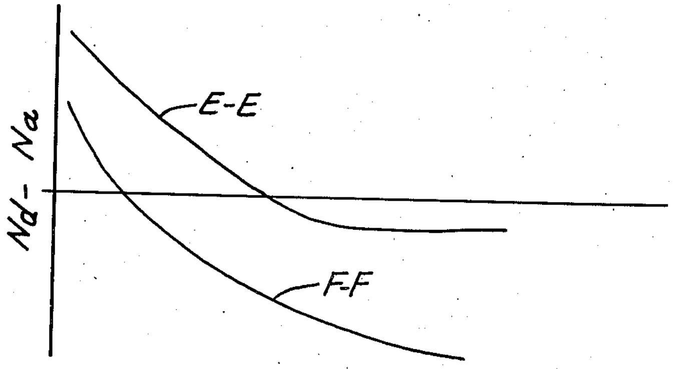

Referring to the drawing:

Figure 1 is a perspective view of a transistor embodying the invention;

Figures 2A–C are sectional views illustrating the steps for forming a transistor embodying the invention;

Figure 3 shows concentration profiles along the lines A—A and B—B of Figure 2C;

Figures 4A–C show the steps for forming another transistor embodying the invention;

Figure 5 shows concentration profiles along the lines C—C and D—D of Figure 4C;

Figures 6A–C, Figures 7A–B and Figures 8A–B show other methods for forming transistors embodying the invention; and Figure 9 shows concentration profiles along the lines E—E and F—F of Figure 8B.

Referring to Figure 1, a transistor structure embodying the invention is illustrated. The structure comprises a gate region *g* which comprises a relatively massive block of semiconductive material of one conductivity type, for example, p-type. A layer of semiconductive material 12 of opposite conductivity type forms a p-n junction with the block. The layer may be formed by suitable means, for example, by diffusion. On the other hand, a complete assembly may be formed by the rate growing process with suitable machining operations being carried out to form a block having a layer of material of opposite conductivity type forming a p-n junction therewith. The layer of material 12 includes relatively thick regions which form the source electrode *s*, and the drain electrode *d*, and a thin short intermediate region *c* which forms the channel through which the carriers flow from source to drain. Suitable ohmic connections are made to the base, source and drain.

As is well known, a field effect transistor is operated by increasing and decreasing the width of the space charge region in the channel. As the thickness of the space charge region increases, current flow from source to drain through the channel decreases. A value is finally reached where no current flows from source to drain; this is commonly referred to as the pinch-off value.

Batteries of appropriate polarity are schematically illustrated connected between source and drain and across the p-n junction formed between the layer 12 and gate *g*. The signal to be amplified is represented by the voltage generator connected in series with the gate voltage supply. The voltage modulates the space charge region to control the current flow from source to drain.

It is, of course, apparent that although an n-type channel is illustrated forming a junction with a p-type gate that a suitable unipolar field effect transistor may be constructed in which the channel is p-type and the gate block n-type.

The channel length *l* and channel thickness *a* may be made relatively small, such as by cutting or etching the relatively thin n-type layer.

Figure 2:
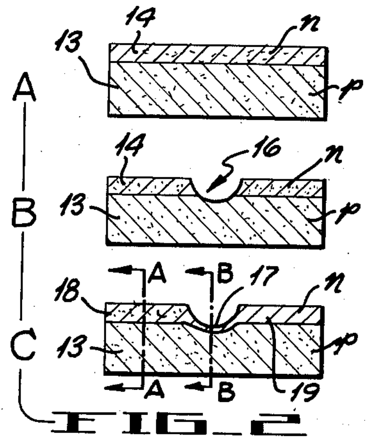

Referring to Figure 2, another method for forming a channel which is small in two directions is illustrated. Starting, for example, with a relatively massive p-type block 13, a relatively thin layer 14 is formed on one surface thereof. The n-type layer may be formed by exposing the p-type block 13 to a source of donors, such that an n-type layer is produced on the surface. Preferably, the n-type layer is thicker than the final channel, dimension *a*, Figure 1, as will presently become apparent. The layer formed on all surfaces but one is removed. A groove 16 is then etched, cut, sawed or otherwise formed which extends through the n-type layer into the p-type block 13 to produce a structure of the type illustrated in Figure 2B. A second diffusion is carried out in the presence of a source of donors. A relatively thin channel 17 is formed which is connected at its ends to the relatively thick source and drain 18 and 19, Figure 2C. Ohmic contacts (not illustrated) are then made to the block 13, which forms the gate, and to the source and drain regions 18 and 19.

It is noted that the layer in the region of the source and drain contacts is relatively thick. This makes it possible to pinch-off the transistor at a lower voltage than that at which the space charge region widens enough to reach the ohmic source and drain contacts. If the space charge regions should reach the source and drain contacts, the gate impedance would be considerably reduced. Another method of decreasing the likelihood of the space charge region extending to the source and drain contacts is to heavily dope the region adjacent the contacts. A method for producing such a region will be presently described.

The field effect transistor structure described is relatively small. As a consequence, extra capacitances exist from the gate to the regions where contact is made to the source and drain. These capacitances serve to reduce the high frequency characteristics of the device. To improve these high frequency characteristics, these capacitances should be reduced as much as possible. By making the contact areas to the source and drain regions as small as possible, the capacitance between gate and these contacts is reduced. The capacitance may be reduced further by lowering the concentration gradient at the p-n junction between the gate and source, and the gate and drain. Referring to the structure shown in Figure 2, the surface concentrations may be controlled in the diffusion process to produce concentration profiles of the type shown in Figure 3 for profiles taken along the lines A—A and B—B of Figure 2C. It is noted that the concentration gradient at the source to gate and drain to gate electrodes is reduced while the concentration gradient between the channel and gate is maintained relatively high.

A method of producing a transistor structure having relatively low capacitance is by out-diffusion from a nearly compensated semiconductive block. In general, acceptors diffuse much more rapidly than donors in silicon. Thus, the structure can be made as illustrated in Figures 4A–C. A nearly compensated p-type crystal 21 containing $10^{15}$ to $10^{17}$ atoms of arsenic, or antimony three times as much aluminum is out-diffused by heating to a high temperature in the presence of a sink for the impurity, such as a vacuum or cold trap. Since the aluminum diffuses much more rapidly than the donor, the surface layer 22 will become n-type. The resulting structure is schematically shown in Figure 4A. A groove 23 is then formed by etching, cutting or the like which extends through the n-type layer into the base p-type layer, Figure 4B. A second out-diffusion is performed for a shorter period of time which results in a thinner n-type layer 24 in the bottom of the groove 23, Figure 4C. The surface layer on all surfaces except the one containing the source, drain and channel is removed. Suitable contacts are made to the source, drain and gate regions.

The concentration gradients for the structure of Figure 4C along the lines C—C and D—D are shown in Figure 5. Thus, it is seen that the concentration gradient at the source to gate, and drain to gate junctions is considerably reduced while the concentration gradient between the channel and the gate remains high.

Figure 6:
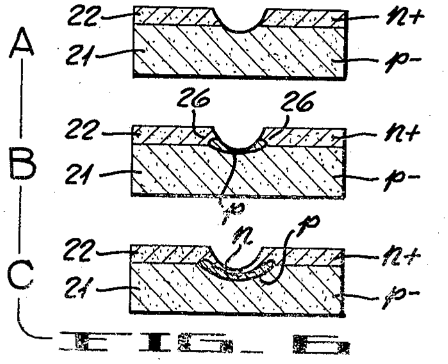

Refering to Figures 6A–C, another method of forming a unipolar field effect transistor which has a low capacity junction with high break-down voltage in the gate and drain areas, and an abrupt junction at the channel is shown. Thus, a block of semiconductive material, for example, weak p-type (p—) has a strong n-type layer (n+) formed thereon. A groove is then formed which extends through the n+ layer into the p— layer, Figure 6A. A diffusion is then carried out in the presence of acceptors to form a p-type layer (p) in the bottom of the groove. The p-type layer should be weaker than the n+ layer whereby no conversion occurs in the portion 26 of the n-type layer, Figure 6B. A subsequent diffusion in the presence of donor forms an n-type layer (n) in the grooved portion. This is then the channel. Source and drain connections are made to the relatively thick n+ edge regions. The resulting structure, Figure 6C, has a low capacity junction between source and gate, and drain and gate, and an abrupt junction between the channel and the gate.

Figure 7:
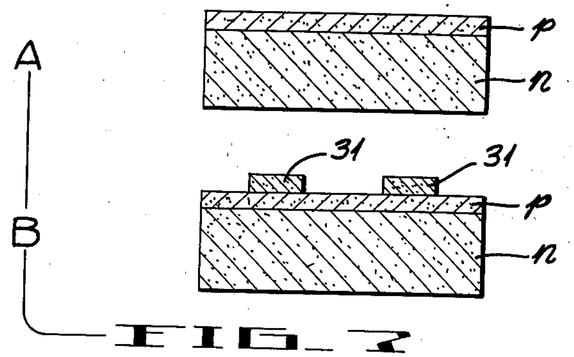

Referring to Figures 7A–B, another method for forming a channel which is small in two directions is illustrated. A block of n-type material has a relatively thin p-type layer diffused thereon. Two metallic areas 31 are then formed over the p-type layer by evaporation or plating. The metal contains an acceptor element such as gold-gallium. The two strips 31 are placed in close proximity whereby the channel length is of predetermined desired length. Subsequent to the placing of the metallic areas, the metal is alloyed into the surface. On recrystallization, regions for source and drain contacts are formed which are either thicker or more highly doped, or both, than the channel.

An alternative method for producing a structure with lowered capacitance is illustrated in Figure 8. A p+ structure of the type illustrated in Figure 8A is made by pulling, rate growing, melt back, or grown-diffusion technique. A suitable n-type impurity is then diffused onto this structure. The layers on all sides are removed and the corners 32 are cut away. The resulting structure is shown in Figure 8B. A thin channel 33 is formed with relatively thick source and drain regions 34 and 36. The charge density along the lines E—E and F—F are shown in Figure 9.

Thus, it is seen that a field effect transistor is formed with a channel that is small in two directions. The source, drain and channel regions are carried by a massive block of material. The structure provides suitable means for forming relatively thick regions with low concentration gradients adjacent the channel to lower the capacitance. Further, means are provided whereby the junction may be tailored to reduce the capacitance and to improve the break-down characteristics.

We claim:

1. A field effect transistor comprising a block of semiconductive material of one conductivity type and a layer of semiconductive material of opposite conductivity type forming a junction therewith, said second layer including a pair of relatively thick regions with low concentration gradients at the junction formed with the block, and a relatively thin portion separating said regions and forming the operating region of the transistor.

2. A field effect transistor comprising a block of semiconductive material of one conductivity type serving to form a gate region, a layer of semiconductive material of opposite conductivity type forming a junction therewith, said layer including source, drain and channel regions, said channel region serving to separate said source and drain regions and being relatively small in two dimensions, and connections to said source, drain and gate regions, the connections to said source and drain regions being relatively small to reduce the capacitance between the connections and the gate region.

3. A field effect transistor comprising a block of semiconductive material of one conductivity type, said block serving to form the gate region, a layer of semiconductive material of opposite conductivity type forming a junction therewith, said layer including source, drain and channel regions, the concentration gradient at the junction between the source and drain regions and the gate being relatively low and the concentration gradient between the channel and gate region being relatively high.

4. A field effect transistor comprising a block of semiconductive material of one conductivity type, said block having a relatively low carrier concentration, a layer of semiconductive material of opposite conductivity type forming a junction therewith, said layer including source, drain and channel regions, said channel region being small in two dimensions and serving to separate the source and drain regions, a region of material of the same conductivity type as the gate region but having a higher carrier concentration forming a junction with the channel and being integral with the gate region.

5. A field effect transistor comprising a block of semiconductive material of one conductivity type, a layer of semiconductive material of opposite conductivity type forming a junction therewith, said layer including a pair of relatively thick regions forming source and drain regions separated by a relatively thin region forming a channel, relatively small ohmic connections made to said source and drain regions, the junction between said source and gate, and said drain and gate having a relatively low concentration gradient and the junction between said channel and gate having a relatively high concentration gradient.

References Cited in the file of this patent

UNITED STATES PATENTS

| | | |
|---|---|---|
| 2,837,704 | Emels | June 3, 1958 |
| 2,854,362 | Brand et al. | Sept. 30, 1958 |
| 2,854,366 | Wannlund et al. | Sept. 30, 1958 |
| 2,858,489 | Henkels | Oct. 28, 1958 |

FOREIGN PATENTS

| | | |
|---|---|---|
| 715,398 | Great Britain | Sept. 15, 1954 |

Disclaimer 2,967,985.—*William Shockley* and *Robert N. Noyce*, Los Altos, Calif., TRANSISTOR STRUCTURE. Patent dated Jan. 10, 1961. Disclaimer filed Nov. 12, 1965, by the inventors; the assignee, *International Telephone and Telegraph Corporation*, assenting.

Hereby enter this disclaimer to claims 1 and 2 of said patent.

[*Official Gazette December 21, 1965.*]